United States Patent [19]

Baker et al.

[11] Patent Number: 4,547,805
[45] Date of Patent: Oct. 15, 1985

[54] TELEVISION AFC SYSTEM USABLE WITH OFFSET CARRIER FREQUENCIES

[75] Inventors: Roy F. Baker, Franklin Park; Frank G. Banach, Oak Lawn, both of Ill.

[73] Assignee: Zenith Electronics Corporation, Glenview, Ill.

[21] Appl. No.: 505,576

[22] Filed: Jun. 20, 1983

[51] Int. Cl.⁴ ............................................. H04N 5/50
[52] U.S. Cl. .................................................. 358/195.1
[58] Field of Search ................ 358/195.1; 334/13, 16, 334/26; 455/261, 262, 263, 264, 257, 258

[56] References Cited

U.S. PATENT DOCUMENTS 3,796,824  3/1974  Baker .................................. 178/5.8
4,091,421  5/1978  Long .................................. 358/195

Primary Examiner—John C. Martin
Assistant Examiner—Howard L. Carter

[57] ABSTRACT

An AFC circuit for a television receiver capable of unambiguous operation with substantially offset signal frequencies has a response characteristic defined by a positive portion intermediate a pair of substantially equally sized negative portions. The circuit includes a multiplier with an unbalanced coupling between the limiter and the discriminator which has a single adjustable tuned circuit nominally tuned to 45.75 MHz.

5 Claims, 5 Drawing Figures

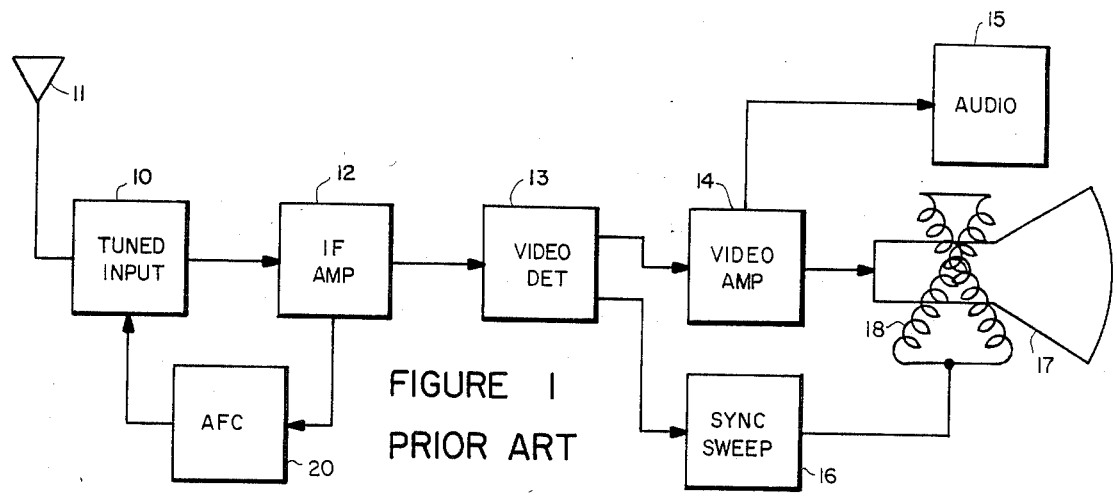
FIGURE 1
PRIOR ART
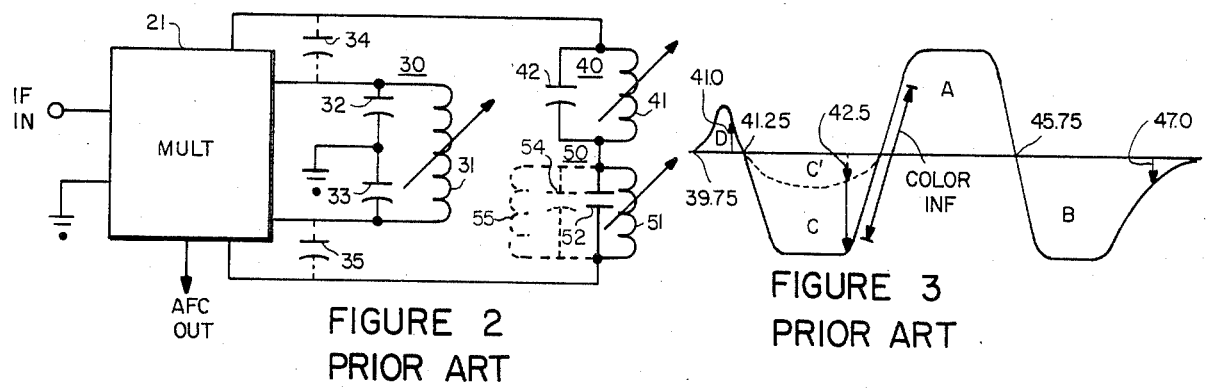
FIGURE 2
PRIOR ART
FIGURE 3
PRIOR ART
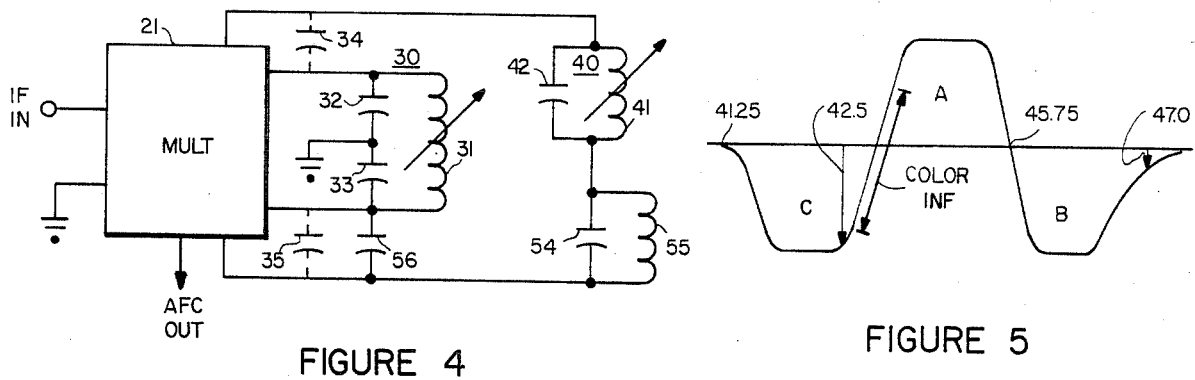
FIGURE 4
FIGURE 5

TELEVISION AFC SYSTEM USABLE WITH OFFSET CARRIER FREQUENCIES

BACKGROUND OF THE INVENTION

This invention relates generally to automatic frequency control circuits and specifically to automatic frequency control circuits for use with television signals having offset picture carrier frequencies.

In U.S. Pat. No. 3,796,824, issued Mar. 12, 1974 to R.F. Baker and assigned to Zenith Radio Corporation, an automatic frequency control circuit for a television receiver is described which utilizes a discriminator and achieves extended pull-in by use of a so called "negative hook" in the vicinity of the sound intermediate frequency (IF) carrier. As discussed in the patent, with varactor tuners particularly which are sensitive to even small D.C. changes in discrimination output, the "negative hook" extends the AFC pull-in range especially under poor signal or tuning conditions. The separate control effects from the picture IF carrier and the sound IF carrier tend to augment each other in contrast with conventional AFC systems characteristics. Thus the pull-in range is enhanced.

U.S. Pat. No. 4,091,421, issued May 23, 1978 to Michael E. Long, and also assigned to Zenith Radio Corporation, discloses a balanced multiplier product detector, especially for use with linear synchronous detectors having no need for sound trapping, which has a large "negative hook" and a small positive response area on the low frequency side to achieve enhanced pull in by using the sound carrier to produce complementary control effects for both high and low signal offsets. A drawback of both circuits is that two tuning adjustments are required which of course adds to labor costs.

The above described patented AFC circuits with negative hooks work very well with assigned frequency broadcast signals which generally have a sound carrier that is 7 to 10 dB down from the picture carrier.

The advent of cable systems however has given rise to television signals that are not subject to the stringent FCC regulations governing over-the-air transmissions. On such cable systems, the sound carrier may be as much as 20 dB down from the picture carrier and additionally, the picture carrier may be offset by 1 to 2 MHz. In an HRC (harmonically related carrier) mode most channels are down-shifted 1.25 MHz whereas in an IRC (inter-harmonically related carrier) mode channels 5 and 6 are down-shifted 2 MHz. These frequency shifts and sound reductions help the cable operators reduce radio frequency interference problems to a significant degree. Unfortunately, the effect on the television receiver is not beneficial. Specifically the AFC circuit in the receiver must be capable of extended pull-in to assure proper "locking" to the signal having an offset carrier frequency and a very low level sound carrier.

If for example the picture carrier is offset to produce an IF frequency of 47 MHz (rather than 45.75 MHz) it will be nearly outside of the conventional AFC response characteristic and therefore produce very little control effect for pull-in. With the response characteristic discussed, adjacent signal carriers may fall in the positive hump adjacent to the negative hook and yield an erroneous control effect. A modified circuit without the positive hump removed this problem but at the expense of also diminishing the amplitude of the negative hook portion. This low level sound carriers in the negative hook portion of the response characteristic had a diminished control effect. Thus, the result is often insufficient control voltage for proper AFC action, or erroneous AFC action. Further, in the circuit with the diminished negative hook, the offset color subcarrier could occur at a point between the negative hook portion and the higher frequency positive going portion of the AFC response which could cause the upper sidebands of the color signal to have more control effect than the lower sidebands. Thus the AFC action could produce a correction signal tending to tune the receiver in the wrong direction.

In a practical receiver installation with direct channel number tuning, a tuner phase-lock scan system is used to tune the receiver's local oscillator frequency to the incoming signal frequency. If, for example, channel 2 is entered, the varactor tuner is initially tuned to the assigned frequency of channel 2. The AFC circuit produces an output causing the receiver tuning system to scan in the indicated direction toward the appropriate limit frequency for the channel and then "come around" to scan toward the middle of the band from the other direction. If the receiver AFC doesn't lock in, scanning stops at the assigned frequency. If the AFC response characteristic is such that pull-in doesn't occur, the tuning system is locked out and the channel number must be reentered. Since the band is only scanned once, scanning is relatively slow to avoid missing weak signals. Thus the time between the entry of the channel and lock-in of the receiver tuner is undesirably extended should scanning be started in the wrong direction because of an erroneous initial AFC response.

Thus there is a need in the art for an AFC system for a television receiver which is capable of unambiguously producing AFC correction signals in the presence of television signals that are substantially offset from assigned frequencies. Preferably such a system should include a minimum of tuned circuits for ease in alignment and low cost.

OBJECTS OF THE INVENTION

Accordingly, the principal object of this invention is to provide an improved AFC system for a television receiver.

Another object of this invention is to provide a novel AFC system for use with a television receiver capable of receiving signals that are substantially offset from assigned frequencies.

A further object of this invention is to provide an AFC system which yields an unambiguous output even with signals that are offset from assigned frequencies.

SUMMARY OF THE INVENTION

In accordance with the invention an automatic frequency control circuit for a television receiver has an AFC circuit response characteristic including a first polarity portion intermediate substantially equal second and third opposite polarity portions, the zero crossing between said first portion and said second portion occurring at substantially the nominal picture IF carrier frequency to enable said AFC circuit to function with standard television signals as well as those having offset carrier frequencies.

BRIEF DESCRIPTION OF THE DRAWINGS

These and other objects of the invention will be apparent by reading the following description of the preferred embodiment thereof in conjunction with the drawings in which;

FIG. 1 represents a block diagram of a conventional television receiver having an AFC circuit;

FIG. 2 represents a partial schematic diagram of prior art AFC circuits in the receiver of FIG. 1;

FIG. 3 represents the response curves for the prior art AFC circuits of FIG. 2;

FIG. 4 represents an AFC circuit constructed in accordance with the invention; and FIG. 5 represents the response curve of the AFC circuit of FIG. 4.

DESCRIPTION OF THE PREFERRED EMBODIMENT

Referring to FIG. 1, a tuned input circuit 10 receives incoming television signals via an antenna 11 and converts them, by the well known superheterodyne process, into intermediate frequency signals which are conveyed to an IF amplifier 12 where they are processed and supplied to a video detector 13 for detection. The output of video detector 13 feeds a video amplifier 14 which, in turn, supplies a cathode ray tube (CRT) 17 for reproducing video information on the screen thereof. The output of video amplifier 14 is also supplied to an audio circuit 15 for reproducing the audio accompaniment of the television signal. The output of video detector 13 also supplies a sync sweep circuit 16 whose output is applied to a plurality of deflection coils 18 positioned adjacent the neck of CRT 17 for developing an appropriate magnetic deflection field therefor. An AFC circuit 20 couples IF amplifier 12 to tuned input circuit 10 for controlling a varactor diode tuner therein (not shown) to receive a selected one of the incoming television carrier frequencies. All of the above circuits and functions thereof are well known in the art.

In FIG. 2 a detailed drawing of two prior art AFC circuits are shown with the circuit corresponding to U.S. Pat. No. 4,091,421 being illustrated in solid lines and a later modification of that circuit being illustrated by dashed lines. Referring to the earlier solid line circuit it includes a multiplier 21, having an IF input and an AFC output, which is coupled to limiter and discriminator tuned circuits. For example, discriminator tuned circuit 40 includes an adjustable coil 41 connected in parallel with a capacitor 42 and is tuned to the normal picture IF carrier frequency of 45.75 MHz. It is connected in series with another discriminator tuned circuit 50 (solid lines) including an adjustable coil 51 in parallel with a capacitor 52, and the tuned frequency of which is the sound IF carrier frequency of 41.25 MHz. Tuned circuits 40 and 50 are balanced driven discriminator AFC resonant circuits. Multiplier 21 also has a limiter 30 coupled thereto which includes an adjustable coil 31 connected in parallel with a pair of series-connected capacitors 32 and 33, the junction of which is grounded. Capacitors 34 and 35, coupled between limiter tuned circuit 30 and discriminator tuned circuits 40 and 50, represent stray capacitances, the values of which are governed by the configuration of the printed circuit board layout. These capacitors are quite small, on the order of 1 or 2 picofarads. The response characteristic for this circuit is indicated by the solid line curve in FIG. 3 and is seen to include a large positive portion A straddled by a pair of similar sized negative portions B and C. The zero crossing between portions A and B occurs at approximately 45.75 MHz and the zero crossing between portions A and C occurs at approximately 43.25 MHz. A smaller positive going portion D extends between approximately 39.75 MHz and 41.25 MHz. A conventional television signal has its IF picture carrier at 45.75 MHz and its IF sound carrer at 41.25 MHz. Any small displacement or offset, either up or down, results in portions C and D producing control effects augmenting those from portions A and B. As indicated by the single arrows, a picture carrier that is offset by 1¼ MHz, for example, would produce a response corresponding to 47.0 MHz and its sound carrier would produce a response corresponding to 42.5 MHz. While both the picture and audio carriers are producing a net negative output voltage from the AFC circuit and are thus acting in concert to bring the receiver into tune, the portion D produces an oppositely directed control effect from an adjacent carrier 6 MHz away from the 47.0 carrier at approximately 41.0 MHz. Thus the circuit illustrated by the solid lines may experience difficulty with offset carriers because of the presence of positive portion D.

A modification to eliminate the positive portion D is illustrated by the dashed line portions of FIGS. 2 and 3. In place of 41.25 MHz tuned circuit 50, an untuned circuit comprising a capacitor 54 and a RF choke coil 55 was used. The change in response characteristic produced is illustrated by the dashed line portion C'. It should be clearly understood that portions A and B remained substantially the same and portion D was eliminated by removal of the second tuned circuit. An added advantage was obtained in that elimination of this 41.25 MHz tuned circuit involved lower cost parts and also removed an adjustment. For most television signals the AFC gain of the receiver enabled the response characteristic indicated by the dashed line of FIG. 3 to work quite well. However, for offset signals the control effect produced by the sound IF was very weak with the result, as indicated above, that the AFC system would often fail to lock, or it would initially yield a wrong tuning direction.

The circuit of the invention and its response, as depicted in FIGS. 4 and 5 obtains the desirable large negative hook portion C of the prior art without the necessity of a 41.25 MHz tuned circuit and thus eliminates the positive going small portion D. This circuit will be seen to be the dashed line circuit of FIG. 2 with an additional capacitor 56 added between the lower end of coil 31 and the lower lead to the AFC discriminator which parallels stray capacitance 35. For normal signals, response will be substantially the same as with the prior art AFC system. However, as illustrated by the signal arrows, for offset carriers the AFC system of the invention responds unambiguously. Note that with a 47.0 MHz picture carrier, and especially with a 42.5 MHz sound carrier, a large correction voltage or control effect of proper polarity is produced. Further any control effects generated by color information (indicated by the double-headed arrow) tend to balance out and not produce an erroneous AFC output. Finally, the elimination of the positive portion D below 41.25 MHz precludes development of erroneous control effects from adjacent channel carriers.

Thus it may be seen that with the invention an AFC response characteristic provides an unambiguous AFC control effect even with carrier frequencies that are substantially offset. It is recognized that numerous modifications and variations in the described embodiment of the invention will be apparent to those skilled in the art without departing from its true spirit and scope. The invention is to be limited only as defined in the claims.

What is claimed is:

1. An AFC circuit comprising a multiplier, a limiter tuned circuit and a discriminator coil circuit including a single tuned circuit for processing both normal television signals and television signals having offset carrier frequencies, said AFC circuit having a response characteristic including a first portion of one polarity intermediate second and third substantially equal portions of opposite polarity with the zero crossing between said first portion of said second portion occurring at the normal IF picture carrier frequency and the zero crossing between said first portion and said third portion occurring approximately midway between the normal IF picture carrier frequency and the normal IF sound carrier frequency.

2. An AFC circuit as set forth in claim 1 wherein said single tuned circuit is tuned to said normal IF picture carrier frequency.

3. An AFC circuit as set forth in claim 2 wherein said discriminator coil circuit also includes an untuned arrangement of a capacitor and a RF choke inductor connected in series with said single tuned circuit.

4. An AFC circuit as set forth in claim 3 wherein said limiter tuned circuit is coupled to said discriminator coil circuit by stray capacitances, and means increasing the capacitance between one portion of said limiter tuned circuit to one portion of said discriminator coil circuit, whereby said multiplier produces an AFC output voltage in response to the reduced sound carrier power which is of the correct polarity to minimize pull-in time and the risk of AFC lockout.

5. An AFC circuit for processing both normal television signals and television signals having offset carrier frequencies comprising a multiplier, a limiter tuned circuit, and a discriminator coil circuit, said discriminator coil circuit comprising a tuned circuit tuned to the normal IF picture carrier frequency and an untuned arrangement of a capacitor and an RF choke inductor connected in series with said tuned circuit, said limiter tuned circuit being coupled to said discriminator coil circuit by stray capacitances and further including means increasing the capacitance between one portion of said limiter tuned circuit and one portion of said discriminator coil circuit for driving said discriminator coil circuit such that said AFC circuit exhibits a response characteristic including a first portion of one polarity intermediate second and third substantially equal portions of opposite polarity with the zero crossing between said first and second portions occurring at the normal IF picture carrier frequency and the zero crossing between said first and third portions occurring approximately midway between the normal IF picture carrier frequency and the normal IF sound carrier frequency.

* * * * *